United States Patent
Yoshikawa et al.

(10) Patent No.: US 7,625,676 B2
(45) Date of Patent: Dec. 1, 2009

(54) PHOTOMASK BLANK, PHOTOMASK AND FABRICATION METHOD THEREOF

(75) Inventors: Hiroki Yoshikawa, Joetsu (JP); Yukio Inazuki, Joetsu (JP); Yoshinori Kinase, Joetsu (JP); Satoshi Okazaki, Joetsu (JP); Takashi Haraguchi, Tokyo (JP); Masahide Iwakata, Tokyo (JP); Yuichi Fukushima, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 645 days.

(21) Appl. No.: 11/255,135

(22) Filed: Oct. 21, 2005

(65) Prior Publication Data
US 2006/0088774 A1    Apr. 27, 2006

(30) Foreign Application Priority Data

| Oct. 22, 2004 | (JP) | 2004-308430 |
| Oct. 22, 2004 | (JP) | 2004-308445 |
| Jul. 29, 2005 | (JP) | 2005-220562 |
| Jul. 29, 2005 | (JP) | 2005-220587 |

(51) Int. Cl.
*G03F 1/00* (2006.01)
*B32B 17/00* (2006.01)

(52) U.S. Cl. .................. 430/5; 428/430
(58) Field of Classification Search .................. 430/5; 428/428, 430; 378/35
See application file for complete search history.

(56) References Cited
U.S. PATENT DOCUMENTS

| 5,415,953 | A | 5/1995 | Alpay et al. |
| 6,037,083 | A | 3/2000 | Mitsui |
| 6,524,755 | B2 | 2/2003 | Jin et al. |
| 6,576,374 | B1 | 6/2003 | Kim |
| 6,617,265 | B2 | 9/2003 | Tanaka et al. |
| 7,348,105 | B2 * | 3/2008 | Ishibashi et al. ............. 430/5 |
| 2002/0028392 | A1 | 3/2002 | Jin et al. |

(Continued)

FOREIGN PATENT DOCUMENTS

DE    10307518    4/2003

(Continued)

OTHER PUBLICATIONS

Communication dated Dec. 9, 2008 regarding corresponding European Patent Application No. 05 022 691.9.

(Continued)

*Primary Examiner*—Stephen Rosasco
(74) *Attorney, Agent, or Firm*—Finnegan, Henderson, Farabow, Garrett & Dunner LLP

(57) ABSTRACT

A light-shieldable film is formed on one principal plane of an optically transparent substrate, and the light-shieldable film has a first light-shieldable film and a second light-shieldable film overlying the first light-shieldable film. The first light-shieldable film is a film that is not substantially etched by fluorine-based (F-based) dry etching and is primarily composed of chromium oxide, chromium nitride, chromium oxynitride or the like. The second light-shieldable film is a film that is primarily composed of a silicon-containing compound that can be etched by F-based dry etching, such as silicon oxide, silicon nitride, silicon oxynitride, silicon/transition-metal oxide, silicon/transition-metal nitride or silicon/transition-metal oxynitride.

24 Claims, 8 Drawing Sheets

U.S. PATENT DOCUMENTS

| | | |
|---|---|---|
| 2002/0068229 A1 | 6/2002 | Westerman et al. |
| 2004/0023134 A1 | 2/2004 | Rolfson |
| 2005/0019674 A1 | 1/2005 | Okubo et al. |
| 2006/0057469 A1 | 3/2006 | Kureishi et al. |

FOREIGN PATENT DOCUMENTS

| | | |
|---|---|---|
| EP | 0 583 942 A2 | 2/1994 |
| EP | 1 439 418 A2 | 7/2004 |
| EP | 1 811 335 A1 | 7/2007 |
| JP | 63-085553 | 4/1988 |
| JP | 2000-181049 | 6/2000 |
| JP | 2001-033940 (A) | 2/2001 |
| JP | 2001-312043 | 11/2001 |
| JP | 2002-131883(A) | 5/2002 |
| JP | 2003-195479 | 7/2003 |
| JP | 2003-195483 | 7/2003 |
| TW | 521318 | 2/2003 |
| WO | WO 2004/006014 A2 | 1/2004 |
| WO | WO 2004/070472 A2 | 8/2004 |

OTHER PUBLICATIONS

Wu-Song Huang, "Current Developments of A High Performance CA Resist for Mask Making Application," Proceedings of the SPIE, vol. 5130: 58-66 (2003).

European Search Report mailed by European Patent Office for EP 05 022 691.9 dated Apr. 19, 2006.

Communication pursuant to Article 96(2) EPC mailed by European Patent Office for EP 05 022 691.9 dated Nov. 6, 2007.

European Search Report mailed by European Patent Office for EP 08 004 173.4 dated Jun. 12, 2008.

Summons to attend oral proceedings pursuant to Rule 115(1) EPC mailed by European Patent Office for EP 05 022 691.9 dated Jun. 30, 2008.

* cited by examiner

PHOTOMASK BLANK, PHOTOMASK AND FABRICATION METHOD THEREOF

BACKGROUND OF THE INVENTION

1. Field of the Invention

The present invention relates to a photomask technique used in micromachining of a semiconductor integrated circuit, a charge-coupled device (CCD), a color filter for a liquid crystal display (LCD) element, a magnetic head or the like.

2. Description of the Related Art

In recent years, in order to meet the demand for miniaturization of circuit patterns involved with the increasing packaging density of large-scale integrated circuits, advanced semiconductor micromachining techniques have become extremely important. For example, increasing the packaging density of a large-scale integrated circuit essentially requires a technique of thinning wires of wiring patterns in the circuit or a technique of miniaturizing a contact hole pattern for interlevel wiring of a cell. The trend toward miniaturization of circuit patterns of large-scale integrated circuits is being accelerated because it is the most effective approach to increase the operation speed thereof and reduce the power consumption thereof.

Most of such advanced micromachining is based on the photolithography technique using a photomask. Therefore, the photomask, as well as the exposure apparatus and the resist material, is a fundamental technique for miniaturization. Therefore, in order to provide a photomask having a wiring pattern of thinned wires and a miniaturized contact hole pattern described above, development of a technique for forming a finer and more precise pattern on a photomask blank has been pursued.

To form a highly precise photomask pattern on a photomask substrate, it is essential that a resist pattern formed on a photomask blank is highly precise. When micromachining a semiconductor substrate, reduction projection photolithography is performed, and therefore, the size of the pattern formed on the photomask is about four times as large as the size of the pattern formed on the semiconductor substrate. However, this does not mean that the restriction on the precision of the pattern formed on the photomask is relaxed. On the contrary, the photomask pattern has to be formed with higher precision than the pattern provided on the semiconductor substrate after exposure.

Furthermore, at present, circuit patterns written on semiconductor substrates by photolithography are significantly small compared with wavelengths of exposure light. Thus, if a photomask that has a photomask pattern formed from a circuit pattern on a semiconductor substrate through 4-fold magnification is used to perform reduction projection exposure, the photomask pattern cannot be accurately transferred onto the resist film due to interference of the exposure light or the like.

Thus, as a super-resolution mask, there are commonly used an OPC mask that corrects the optical proximity effect, which degrades the transfer characteristics, by application of the so-called optical effect correction (OPC) and a phase shift mask that makes the phases of adjacent aperture patterns different by 180°, thereby making the optical amplitude at the middle of the adjacent aperture patterns zero. For example, on the OPC mask, an OPC pattern (a hammer head, an assist bar or the like) that has a size one-half or less the size of the circuit pattern has to be formed.

As described above, not only the photolithography for forming a circuit pattern on a semiconductor substrate but also the photolithography for forming a pattern on a photomask blank require a highly precise patterning technique. One of indications of the performance of the photolithography technique is the "limiting resolution". The photolithography used in patterning of a photomask is required to have a limiting resolution equal to or higher than that of the photolithography used in circuit patterning on a semiconductor circuit.

Typically, when forming a photomask pattern, a photoresist film is formed on a photomask blank having a light-shielding layer on a transparent substrate, the photoresist film is irradiated with an electron beam to write a pattern thereon, and the photoresist film is developed to provide a resist pattern. Then, using the resist pattern as an etching mask for the light-shielding layer, the light-shielding layer is patterned to form a photomask pattern. In order to form a fine photomask pattern by such an approach, it is important to make the photoresist film thinner and to select an appropriate material for the light-shielding layer.

As the photomask pattern to be formed becomes finer, the resist pattern becomes finer. However, if the resist pattern is miniaturized without reducing the thickness of the resist film, the aspect ratio (that is, the ratio between the resist thickness and the pattern width) of the part of the resist serving as the etching mask for the light-shielding layer increases.

In general, as the aspect ratio of the resist pattern increases, the pattern becomes more susceptible to degradation, and if the resist pattern is used as the etching mask, the precision of the transfer thereof onto the light-shielding layer decreases. In an extreme case, a part of the resist pattern may fall or peel off, resulting in a defective pattern. Thus, as the photomask pattern becomes finer, the thickness of the resist film used as the etching mask for the light-shielding layer has to be reduced to prevent the aspect ratio thereof from being undesirably great.

On the other hand, as for the material of the light-shielding layer that is to be patterned using the photoresist as an etching mask, many materials have already been proposed. Among others, chromium compound can contain a large amount of information, so that the chromium compound has been practically always used as the material of the light-shielding film, and forming the light-shielding film from the chromium compound has been substantially established as a standard process step. For example, in Japanese Patent Laid-Open Nos. 2003-195479 and 2003-195483 and Registered Japanese Utility Model No. 3093632, there has been disclosed a structure of a photomask blank in which a light-shielding film having a light-shielding capability, which is required for a photomask blank designed for ArF exposure, is made of chromium compound.

In general, the light-shielding film made of chromium compound is patterned by oxygen-and-chlorine-based dry etching. However, such etching often has a significant effect on an organic film, such as the photoresist. Thus, if the light-shielding film is etched using a relatively thin resist film as a mask, the resist is damaged during the etching, the configuration of the resist pattern changes, and it is difficult to accurately transfer the original resist pattern onto the light-shielding film.

However, it is technically difficult to make the photoresist, which is an organic film, have both high resolution and patterning precision and high etching resistance. As far as a conventional patterning process is used, there is a tradeoff between the resolution and the etching resistance. Specifically, the photoresist film has to be made thinner to achieve higher resolution, while thinning of the photoresist film has to be limited to assure the etching resistance during the patterning step.

Thus, in order to form a highly precise photomask pattern while reducing the burden on a photoresist, it is necessary to propose a novel structure of a photomask blank by selecting an optimal material for a light-shielding film.

SUMMARY OF THE INVENTION

As for the material of a light-shielding film, many investigations have already been made. For example, in Japanese Patent Laid-Open No. 2001-312043, there is reported an example in which a tantalum metal film is used as a light-shielding layer for ArF exposure. In this example, a tantalum metal film is used as a light-shielding layer, a tantalum oxide film is used as an antireflection layer, and the two layers are etched using a fluorine-based gas plasma, which is relatively unlikely to damage a photoresist, in order to reduce the burden on the photoresist during etching. However, even if such etching condition is selected, as far as the two layers, that is, the light-shielding layer and the antireflection layer, are etched using only the photoresist as a mask, reduction of the burden on the photoresist is limited, and it is difficult to sufficiently satisfy the demand for highly precise formation of a fine photomask pattern.

Alternatively, there has been known a technique of reducing the burden on the photoresist during dry etching by using a hard mask. For example, in Japanese Patent Laid-Open No. 63-85553, there is disclosed a technique of dry-etching a metal silicide film using a $SiO_2$ film formed on the metal silicide film as an etching mask. However, the $SiO_2$ film has a poor conductivity, so that a problem of charge-up tends to occur during exposure to an electron beam. Furthermore, defect inspection of the photomask blank is typically based on the reflectivity thereof, light having a wavelength of 257 nm is used for the defect inspection of a mask for ArF-exposure, and the reflectivity is required to fall within a range of about 10 to 20% for the light of that wavelength in order to achieve accurate defect inspection. However, if the $SiO_2$ film is used as an etching mask, there occurs a problem that the $SiO_2$ film has an excessively high reflectivity, which interferes with the defect inspection.

As described above, conventional photomask blank structures cannot satisfy the demand for highly precise formation of fine photomask patterns. This problem is significant in the case of a photomask for photolithography using exposure light having a short wavelength of 250 nm or shorter for which high resolution is required (KrF: 248 nm, ArF: 193 nm, $F_2$: 157 nm) and is serious in the case of a photomask for forming a resist pattern of 65-nm-or-less rule. Thus, selection of the material of the light-shielding film suitable for forming a highly precise photomask pattern while reducing the burden on the photoresist is extremely important.

The present invention has been devised in view of such problems, and an object thereof is to provide a photomask blank that has a light-shielding film in which a fine photomask pattern can be formed with high precision due to reduction of the burden on a photoresist used as a mask during formation of the photomask pattern, and a photomask fabricated using the photomask blank.

In order to attain the object, according to a first aspect of the present invention, there is provided a photomask blank comprising a light-shieldable film formed on a substrate that is transparent to exposure light, the light-shieldable film comprising a first light-shieldable film formed on the substrate and a second light-shieldable film overlying the first light-shieldable film, in which the first light-shieldable film comprises a layer primarily composed of chromium (Cr) that is not substantially etched by fluorine-based dry etching, and the second light-shieldable film comprises a layer primarily composed of a silicon-containing compound that is capable of being etched by fluorine-based dry etching.

Preferably, the silicon-containing compound is silicon oxide, silicon nitride, silicon oxynitride, silicon/transition-metal oxide, silicon/transition-metal nitride or silicon/transition-metal oxynitride. More preferably, the transition metal is at least one metal element selected from among titanium (Ti), vanadium (V), cobalt (Co), nickel (Ni), zirconium (Zr), niobium (Nb), molybdenum (Mo), hafnium (Hf), tantalum (Ta) and tungsten (W).

Preferably, the second light-shieldable film has an optical density of 0.2 to 3.0 for the exposure light. More preferably, the second light-shieldable film has an optical density of 0.5 to 2.5 for the exposure light. Furthermore, preferably, the second light-shieldable film has a thickness that is equal to or more than 10 nm and equal to or less than 55 nm. More preferably, the second light-shieldable film has a thickness that is equal to or more than 25 nm and equal to or less than 55 nm.

Furthermore, the extinction coefficient k of the second light-shieldable film at a wavelength of the exposure light preferably has a profile that gradually decreases from the side of the substrate to the surface of the second light-shieldable film, and the first light-shieldable film preferably is a film primarily composed of chromium metal, chromium oxide, chromium nitride, chromium oxynitride, chromium oxycarbide, chromium nitride carbide or chromium oxynitride carbide.

The first light-shieldable film preferably has an optical density of 0.3 to 3.0 for the exposure light, and more preferably has an optical density of 0.5 to 2.0 for the exposure light. The first light-shieldable film preferably has a thickness that is equal to or more than 5 nm and equal to or less than 50 nm, more preferably has a thickness that is equal to or more than 5 nm and equal to or less than 25 nm, and most preferably has a thickness that is equal to or more than 5 nm and equal to or less than 15 nm.

At least one of the first light-shieldable film and the second light-shieldable film can have a multilayer structure comprising a plurality of layers stacked successively, and an optical film can be provided between the transparent substrate and the light-shieldable film. In addition, the optical film can be a film having a phase shift layer.

For example, the phase shift layer is a half-tone phase shift layer, and the half-tone phase shift layer is made of silicon oxide, silicon nitride, silicon oxynitride, silicon/transition-metal oxide, silicon/transition-metal nitride or silicon/transition-metal oxynitride.

Furthermore, for example, the optical film is a film capable of being etched by fluorine-based dry etching, and the time (clear time) required for etching off the optical film by fluorine-based dry etching under the same condition as the second light-shieldable film is longer than the clear time for the second light-shieldable film.

Furthermore, the second light-shieldable film can have an antireflection capability.

According to a second aspect of the present invention, there is provided a method of fabricating a photomask, comprising: a step of providing a photomask blank having a light-shieldable film having a first light-shieldable film formed on a transparent substrate and primarily composed of chromium that is not substantially etched by fluorine-based dry etching and a second light-shieldable film overlying the first light-shieldable film and primarily composed of a silicon-containing compound that is capable of being etched by fluorine-based dry etching; a first step of patterning the second light-shieldable film by fluorine-based dry etching using a photoresist mask formed on the second light-shieldable film; and a second step of patterning the first light-shieldable film by oxygen-and-chlorine-based dry etching using the patterned second light-shieldable film or resist film as a mask.

According to a third aspect of the present invention, there is provided a method of fabricating a photomask, comprising: a step of providing a photomask blank having a light-shieldable film having an optical film capable of being etched by fluorine-based dry etching formed on a transparent substrate, a first light-shieldable film formed on the optical film and primarily composed of chromium that is not substantially etched by fluorine-based dry etching and a second light-shieldable film overlying the first light-shieldable film and primarily composed of a silicon-containing compound that is capable of being etched by fluorine-based dry etching; a first step of patterning the second light-shieldable film by fluorine-based dry etching using a first photoresist mask formed on the second light-shieldable film; a second step of removing the first photoresist mask and providing a second photoresist mask on the patterned second light-shieldable film; a third step of patterning the first light-shieldable film by oxygen-and-chlorine-based dry etching using the patterned second light-shieldable film as a hard mask; a fourth step of patterning the optical film by fluorine-based dry etching using the second photoresist mask and at least one of the first and second light-shieldable films as a mask; and a fifth step of removing the part of the first light-shieldable film that is not covered with the second light-shieldable film.

According to a fourth aspect of the present invention, there is provided a method of fabricating a photomask, comprising: a step of providing a photomask blank having a light-shieldable film having an optical film capable of being etched by fluorine-based dry etching formed on a transparent substrate, a first light-shieldable film formed on the optical film and primarily composed of chromium that is not substantially etched by fluorine-based dry etching and a second light-shieldable film overlying the first light-shieldable film and primarily composed of a silicon-containing compound that is capable of being etched by fluorine-based dry etching; a first step of patterning the second light-shieldable film by fluorine-based dry etching using a first photoresist mask formed on the second light-shieldable film; a second step of patterning the first light-shieldable film by oxygen-and-chlorine-based dry etching using the patterned second light-shieldable film or the first photoresist mask as a mask; a third step of removing the first photoresist mask and providing a second photoresist mask on the patterned second light-shieldable film; a fourth step of patterning the optical film by fluorine-based dry etching using the second photoresist mask and at least one of the first and second light-shieldable films as a mask; and a fifth step of removing the part of the first light-shieldable film that is not covered with the second light-shieldable film.

According to the third and fourth aspects of the present invention, preferably, in the fourth step, the clear time for the part of the second light-shieldable film that is not covered with the second photoresist mask is set shorter than the clear time for the optical film. According to the third and fourth aspects of the present invention, the optical film can be a film including a phase shift layer.

According to the present invention, since an optimal combination of materials that differ in etching characteristics is selected for the first and second light-shieldable films, the burden on a photoresist used as a mask during formation of a photomask pattern can be reduced, and as a result, a fine photomask pattern can be formed with high precision.

DETAILED DESCRIPTION OF THE INVENTION

Figure 1A:
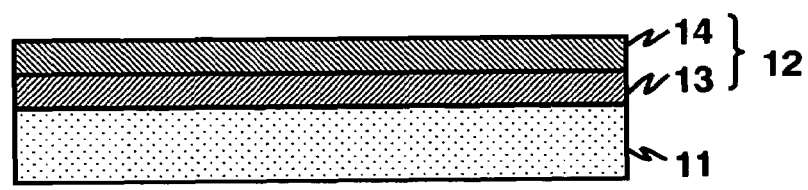
FIGS. 1A and 1B are schematic cross-sectional views for illustrating a basic structure of a photomask blank according to the present invention.

In the following, best modes for carrying out the present invention will be described with reference to the drawings.

Through earnest investigation to reduce the burden on a photoresist serving as a mask during patterning of a photomask, the inventors have reached a conclusion that a problem with a conventional photomask blank lies in the fact that an antireflection film, which overlies a light-shielding film made of a chromium-based material, is made also of a chromium-based material, so that the antireflection film and the light-shielding film have similar etching characteristics (dry-etching characteristics), and as a result, a single photoresist mask has to be used to process both the antireflection film and the light-shielding film. In addition, the inventors have found that the burden on a resist mask during patterning of a photomask can be reduced if materials different in dry-etching characteristics are appropriately selected for a light-shieldable film having an antireflection capability (that is, an effective antireflection film; referred to sometimes as second light-shieldable film hereinafter) and a light-shieldable film serving effectively as a light-shielding film (referred to sometimes as first light-shieldable film hereinafter) and an appropriate combination thereof is achieved.

Thus, according to the present invention, a novel structure is adopted which involves selecting materials different in etching characteristics (different kinds of materials) for the second light-shieldable film having an antireflection capability and the first light-shieldable film serving as an effective light-shielding film and reducing the burden on the resist mask during patterning of the photomask by taking advantage of the etching selectivity.

As described in more detail later, due to the etching selectivity of the materials of the first and second light-shieldable films, the resist mask can be used as an etching mask solely for the second light-shieldable film, and the resulting patterned second light-shieldable film can be used as a hard mask for etching the first light-shieldable film. In particular, if a material that can be processed by fluorine-based dry etching, which is less burdensome to the photoresist, (silicon compound or metal silicide, such as metal-silicon oxide, metal-silicon nitride, or metal-silicon oxynitride, for example) is used for the second light-shieldable film, the burden on the resist mask is greatly reduced, and deformation of the resist pattern is significantly reduced, so that the original resist pattern can be accurately transferred to the second light-shieldable film having an antireflection capability. Then, the resulting patterned second light-shieldable film is used as a hard mask to etch the first light-shieldable film primarily composed of chromium (a chromium-based light-shielding film), thereby transferring a predetermined photomask pattern to the first light-shieldable film serving as an effective light-shielding film. Alternatively, the remaining resist mask can be used for etching the first light-shieldable film primarily composed of chromium (chromium-based light-shielding film).

In addition, with the photomask blank structure according to the present invention, the duration of etching using the resist mask is reduced, so that the resist thickness can also be reduced. Thus, even if the photomask pattern is reduced in size, the aspect ratio does not increase excessively, so that problems including degradation of the pattern transfer accuracy due to degradation of the pattern sharpness and chipping of the pattern due to peel-off of a portion of the resist pattern, can be avoided.

As described above, if a material that can be processed by fluorine-based dry etching, which is less burdensome to the photoresist, is used for the second light-shieldable film, a photoresist mask having a relatively small thickness is formed on the second light-shieldable film for patterning the second light-shieldable film, and the resulting patterned second light-shieldable film is used as a hard mask to etch the first light-shieldable film (chromium-based light-shielding film), the restriction on the thickness of the photoresist film imposed to assure the etching resistance of the photoresist in a step of patterning the photomask blank is eliminated, and the photoresist film can be made thinner to achieve higher resolution. In other words, the problem with the conventional photomask blank structure (the tradeoff between high resolution and high etching resistance) can be eliminated, and a fine photomask pattern can be formed with high accuracy while the burden on the photoresist is reduced.

In the following, the present invention will be described in more detail with reference to examples thereof.

EXAMPLE 1

Basic Structure of Photomask Blank

Figure 1B:

FIGS. 1A and 1B are schematic cross-sectional views for illustrating a basic structure of a photomask blank according to the present invention. According to this basic structure, as shown in FIG. 1A, the photomask blank comprises an optically transparent substrate 11 and a light-shieldable film 12 formed on one principal plane of the substrate 11, and the light-shieldable film 12 comprises a first light-shieldable film 13 and a second light-shieldable film 14 overlying the first light-shieldable film 13. The substrate 11 may be a typical transparent substrate made of quartz glass, $CF_2$, aluminosilicate glass or the like. The first light-shieldable film 13 is a film that is not substantially etched by fluorine-based dry etching (F-based dry etching) and is primarily composed of chromium. The second light-shieldable film 14 is a film primarily composed of a silicon-containing compound that can be etched by F-based dry etching.

The silicon-containing compound that is a primary constituent of the second light-shieldable film 14 may be silicon oxide, silicon nitride, silicon oxynitride, silicon/transition-metal oxide, silicon/transition-metal nitride, or silicon/transition-metal oxynitride. Such a light-shieldable film can assure the conductivity and, thus, has an effect of suppressing charge-up during writing using an electron beam. In particular, when the silicon-containing compound contains a transition metal, this effect is expected to be significant. In addition, as described later, the light-shieldable film is superior in wavelength dependence of the reflectivity.

The transition metal contained in the silicon-containing compound may be at least one metal element selected from among titanium (Ti), vanadium (V), cobalt (Co), nickel (Ni), zirconium (Zr), niobium (Nb), molybdenum (Mo), hafnium (Hf), tantalum (Ta) and tungsten (W). However, molybdenum is most preferable in terms of dry-etching processibility, chemical resistance and conductivity. The film containing such a transition metal can function as an antireflection film that is superior in chemical resistance, conductivity and optical property.

The composition (atomicity ratio: at %) of the silicon-containing compound that forms the second light-shieldable film 14 is determined in such a manner that silicon accounts for 10-95 at %, oxygen accounts for 0-60 at %, nitrogen accounts for 0-57 at % and transition metal accounts for 0-35 at %. Preferably, the silicon-containing compound contains 0.2 or more at % of transition metal. As required, the silicon-containing compound may contain 30 or less at % of carbon.

The second light-shieldable film is designed to have an optical density for exposure light preferably falling within a range of 0.2 to 3.0 so that the optical density of the light-shieldable film comprising the stack of the first and second light-shieldable films to exposure light is 2.5 or higher. More preferably, the optical density of the second light-shieldable film falls within a range of 0.5 to 2.5. In addition, the thickness of the second light-shieldable film 14 is appropriately determined based on the wavelength of the light used for inspection. Typically, the second light-shieldable film 14 can achieve the antireflection effect if the thickness thereof falls within a range of 10 to 45 nm. In the case of a photomask blank used for fabricating a photomask designed for ArF exposure, the second light-shieldable film 14 preferably has a thickness of 15 to 30 nm.

The second light-shieldable film 14 is preferably designed to have an extinction coefficient k whose profile at an exposure light wavelength decreases gradually from the substrate 11 toward the surface. Such a profile can be achieved by varying the concentration of the transition metal in the silicon-containing compound that forms the second light-shieldable film 14. Specifically, as the concentration of the transition metal increases, the extinction coefficient k increases, and as the concentration of the transition metal decreases, the extinction coefficient k decreases. That is, the composition of the second light-shieldable film is designed so that the concentration of the transition metal in the film decreases gradually from the side of the substrate 11 toward the surface.

Alternatively, the above-described profile of the extinction coefficient k can be achieved by varying the concentration of a light element (oxygen, nitrogen or carbon) in the silicon-containing compound. Specifically, as the concentration of the light element increases, the extinction coefficient k decreases, and as the concentration of the light element decreases, the extinction coefficient k increases. That is, the composition of the second light-shieldable film is designed so that the concentration of the light element in the film increases gradually from the substrate 11 toward the surface.

With such an extinction coefficient profile, the light-shielding capability of the second light-shieldable film 14 is increased, and the degree of freedom of thickness determination of the first light-shieldable film 13. Consequently, the amount of side etching of the first light-shieldable film 13 during patterning can be controlled, and the wavelength characteristics of the reflectivity of the first light-shieldable film 13 when serving as an "antireflection film" can be improved.

Besides, if the composition of the second light-shieldable film 14 is designed so that silicon is unsaturated at an interface region between the first and second light-shieldable films 13 and 14, the adhesion of the second light-shieldable film 14 to the first light-shieldable film 13 can be improved. On the other hand, if the composition is designed so that silicon is saturated (or supersaturated) in a region close to the surface thereof, the reflectivity in a region of shorter wavelengths can be reduced, the pattern transfer characteristics to a semiconductor substrate can be improved, and the chemical resistance can be improved.

The first light-shieldable film 13 is a film containing chromium as a primary constituent and is primarily composed of chromium metal, chromium oxide, chromium nitride, chromium oxynitride, chromium oxycarbide, chromium nitride carbide or chromium oxynitride carbide, for example. The composition of the first light-shieldable film 13 is determined in such a manner that chromium accounts for 30-95 at %, oxygen accounts for 0-60 at %, nitrogen accounts for 0-50 at % and carbon accounts for 0-20 at %.

The first light-shieldable film 13 is designed to have an optical density for exposure light preferably falling within a range of 0.3 to 3.0 so that the optical density of the light-shieldable film 12 comprising the stack of the first and second light-shieldable films 13 and 14 to exposure light is 2.5 or higher. More preferably, the optical density of the first light-shieldable film falls within a range of 0.5 to 2.0. In addition, the first light-shieldable film 13 preferably has a thickness equal to or more than 5 nm and equal to or less than 50 nm, and more preferably has a thickness equal to or more than 5 nm and equal to or less than 25 nm. With the thickness design determined in this way, the conductivity of the first light-shieldable film 13 can be adequately reduced, and the side etching during the patterning step can be suppressed.

Typically, the second light-shieldable film 14 is used as the so-called "antireflection film", and the first light-shieldable film 13 is used as the so-called "light-shielding film". However, in this specification, these two films stacked are collectively referred to as "light-shieldable film". The film structure can be designed in various ways. For example, the composition of the second light-shieldable film 14 in a region close to the substrate 11 may be designed so that the content of oxygen or nitrogen is extremely low, thereby making the region function as a part of the "light-shielding film". To the contrary, the composition of the first light-shieldable film 13 in a region close to the second light-shieldable film 14 is designed so that the content of oxygen or nitrogen is relatively high, thereby making the region function as a part of the "antireflection film". In this specification, the first light-shieldable film 13 is regarded as the effective "light-shielding film" even if the first light-shieldable film 13 partially functions also as the "antireflection film", and the second light-shieldable film 14 is regarded as the effective "antireflection film" even if the second light-shieldable film 14 partially functions also as the "light-shielding film".

The first light-shieldable film 13 and the second light-shieldable film 14 of the photomask blank according to the present invention may be each composed of one layer, or either or both of the films may be a multilayer film composed of a plurality of layers stacked each other. In the case of using such a multilayer structure, at least one of the constituent layers of each light-shieldable film preferably has the composition described above. As an alternative to the multilayer structure, the film composition may be varied in a gradient manner (that is, a composition gradient structure may be provided).

If such a composition gradient structure is adopted for the second light-shieldable film (antireflection film), the wavelength region in which a preferred reflectivity for the light used for inspection is obtained can be widened. In addition, if the content of a light element is increased in an outermost region of the light-shieldable film (or a film having a high content of a light element is applied on top of the light-shieldable film), the chemical stability of the surface of the light-shieldable film can be improved. Furthermore, if the content of a light element in an about-10-nm region of the first light-shieldable film (light-shielding film) close to the substrate is increased, thereby reducing the chromium content, in-plane etching variations can be suppressed.

In addition, instead of providing the light-shieldable film 12 directly on the principal plane of the substrate 11, a third optical film 15 may be provided between the substrate 11 and the light-shieldable film 12 (that is, between the substrate 11 and the first light-shieldable film 13), as shown in FIG. 1B. The third optical film 15 may be an etch-stop film, a translucent film or a phase shift film, for example. In the case where a structure of such a third optical film 15 is provided, the third optical film 15 is designed so that the total sum of the optical densities of the third optical film 15, the first light-shieldable film 13 and the second light-shieldable film 14 to the exposure light is 2.5 or higher. Of course, a fourth or fifth optical film may be additionally provided.

The third optical film 15 may be a half toned phase shift layer (or a half-tone phase shift layer). In this case, as with the second light-shieldable film 14 described above, the third optical film 15 preferably has a film composition that can be etched by fluorine-based dry etching, and the material forming the third optical film is preferably selected from among silicon oxide, silicon nitride, silicon oxynitride, silicon/transition-metal oxide, silicon/transition-metal nitride, silicon/transition-metal oxynitride and the like. In addition, the composition and thickness of the third optical film 15 are designed so that the clear time for the third optical film (that is, the time required to etch off the film) under the same condition as the second light-shieldable film 14 is longer than that for the second light-shieldable film 14.

In the case where the second light-shieldable film 14 and the third optical film 15 are made of silicon oxide, silicon nitride, silicon oxynitride, silicon/transition-metal oxide, silicon/transition-metal nitride or silicon/transition-metal oxynitride, the films can be formed by a well-known technique as disclosed in Japanese Patent Laid-Open No. 7-140635, for example. For example, the films may be formed by reactive sputtering in an atmosphere of a reactive gas or a mixture of a reactive gas and an inert gas such as argon using an appropriate combination of targets of silicon and molybdenum or molybdenum silicide.

Similarly, in the case where the first light-shieldable film 13 is primarily composed of chromium oxide, chromium nitride, chromium oxynitride, chromium oxycarbide, chromium nitride carbide or chromium oxynitride carbide, a well-known technique involving reactive sputtering using chromium as a target can be adopted.

These sputtering processes may use a direct-current (DC) power supply or a high-frequency (RF) power supply and may be of the magnetron type or other types. The sputtering gas may be an inert gas, such as Ar and Ne. The reactive gas is appropriately selected for an intended composition. For example, in the case of forming a CrO film, an oxygen-containing gas, such as $O_2$, is used. In the case of forming a CrON film, a mixture of a nitrogen-containing gas, such as $N_2$, $NO_2$, $N_2O$ and NO, and an oxygen-containing gas, such as $O_2$, $N_2O$, NO and $NO_2$, is used. In the case of forming a CrONC film, a mixture of a carbon-containing gas, such as CO, $CO_2$ and $CH_4$, a nitrogen-containing gas, such as $N_2$, $NO_2$, $N_2O$ and NO, and an oxygen-containing gas, such as $O_2$, $N_2O$, NO, $NO_2$ and $CO_2$, is used.

EXAMPLE 2

Fabrication Process of Photomask Blank

With regard to this example, there will be described a fabrication process for providing a photomask blank according to the present invention that has the structure described with regard to the example 1.

[First Light-Shieldable Film (Light-Shielding Film)]

Figure 2:
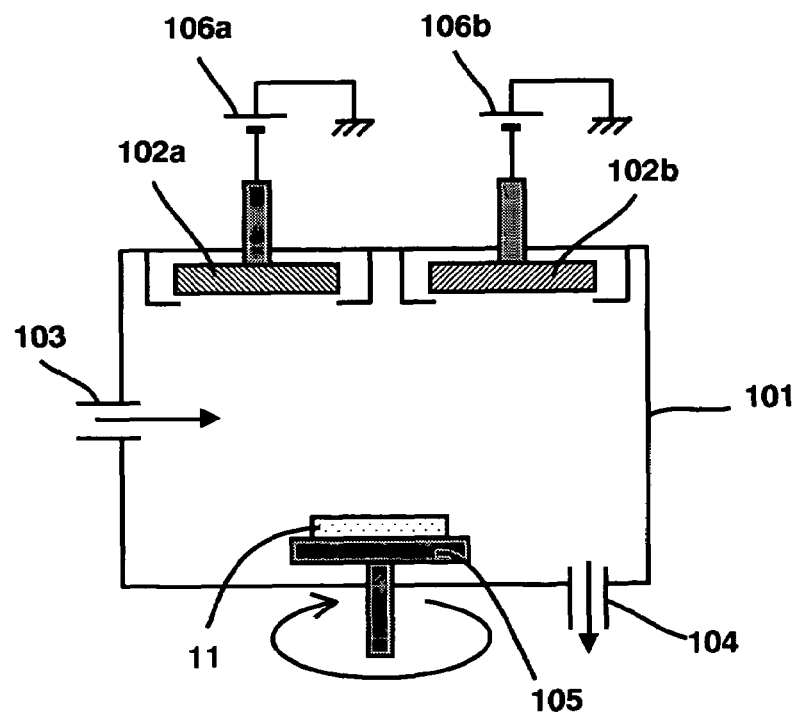
FIG. 2 is a schematic cross-sectional view for illustrating an arrangement of a sputtering apparatus used for forming a film of the photomask blank according to the present invention.

FIG. 2 is a schematic cross-sectional view for illustrating an arrangement of a sputtering apparatus used for forming the first light-shieldable film of the photomask blank according to the present invention. In this drawing, reference numeral 11 denotes a transparent substrate, which is a 6-inch rectangular quartz substrate, reference numeral 101 denotes a chamber, reference numeral 102a denotes a first target, reference numeral 102b denotes a second target, reference numeral 103 denotes a sputtering gas inlet, reference numeral 104 denotes a gas outlet, reference numeral 105 denotes a substrate rotating table, and reference numerals 106a and 106b denote power supplies that apply a bias to the first and second targets, respectively.

In this example, the first target 102a is a chromium target, and only the target is sputtered to form a first light-shieldable film of chromium. The sputtering gas was Ar gas, and the Ar gas and $N_2$ gas were introduced into the chamber 101 at flow rates of 10 sccm and 4 sccm, respectively, to achieve a gas pressure of 0.1 Pa in the chamber. The pre-film-formation heating temperature was 120° C., and a discharge power of 1000 W was applied to the Cr target while the substrate 11 was being rotated at 30 rpm, thereby forming a chromium-nitride film to a thickness of 40 nm, which serves as a first light-shieldable film (light-shielding film). The chromium-nitride film was a CrN film composed of chromium (Cr) and nitrogen (N) in the composition ratio (atomic ratio) 9:1 (Cr:N=9:1).

[Second Light-Shieldable Film (Antireflection Film)]

Using the sputtering apparatus constructed as shown in FIG. 2, a second light-shieldable film (antireflection film) was formed on the first light-shieldable film (light-shielding film), thereby forming a light-shieldable film of a photomask blank according to the present invention. The first target 102a used in this step was a silicon (Si) single crystal, and the second target 102b used in this step was a molybdenum-silicide ($MoSi_3$) polycrystal. The gas flow rate was set so that the gas pressure in the chamber during film formation was 0.1 Pa, and a molybdenum-silicide-compound film (MOSiN film) was formed while the substrate was being rotated at 30 rpm.

Specifically, Ar gas at a flow rate of 20 sccm and $N_2$ gas at a flow rate of 0 sccm were introduced as the sputtering gas into the chamber 101 to achieve a gas pressure of 0.1 Pa in the chamber, discharge powers of 700 W and 300 W were applied to the $MoSi_3$ target and the Si target, respectively, and then, the film formation was started while the substrate 11 was being rotated at 30 rpm. Then, the film was formed to a thickness of about 20 nm while continuously changing the film formation conditions as follows: the flow rate of the Ar gas introduced into the chamber 101 was gradually decreased to 5 sccm, and the flow rate of the $N_2$ gas introduced into the chamber 101 was increased to 50 sccm to keep the gas pressure in the chamber at 0.1 Pa; and the discharge power applied to the $MoSi_3$ target was decreased to 100 W, and the discharge power applied to the Si target was increased to 900 W. Under such film formation conditions, a film can be formed that has a "composition gradient structure" in which the content of a transition metal or nitrogen in the film varies gradually.

[Third Optical Film]

As with the first and second light-shieldable films, the third optical film is also formed using the sputtering apparatus constructed as shown in FIG. 2. As described earlier, in the case where the third optical film is a half-tone phase shift layer, the film is preferably made of silicon oxide, silicon nitride, silicon oxynitride, silicon/transition-metal oxide, silicon/transition-metal nitride or silicon/transition-metal oxynitride. Thus, the sputtering target is appropriately selected depending on the compound forming the half-tone phase shift layer, and the third optical film is formed under generally the same conditions as the second light-shieldable film described above.

The half-tone phase shift layer may be a composite film comprising a stack of films of different compositions. The half-tone phase shift layer is designed to have such a composition that the single-layer or multilayer film made of one or more materials selected from among those described above have a transmittance of 2-40% and a phase shift of about 180°. A specific example of the film formation is as follows.

First, using a Si single crystal as the first target 102a and a $MoZrSi_4$ sintered body as the second target 102b, discharge powers of 560 W and 1000 W were applied to the $MoZrSi_4$ target and the Si target, respectively, while the substrate 11 was being rotated at 30 rpm, thereby sputter-forming an optical adjustment layer to a thickness of 10 nm on the substrate 11. The sputtering gas used was a mixture gas containing Ar gas at a flow rate of 8 sccm, $N_2$ gas at a flow rate of 20 sccm and $O_2$ gas at a flow rate of 5 sccm. The gas pressure in the chamber during sputtering was set at 0.15 Pa.

Then, the discharge powers applied to the $MoZrSi_4$ target and the Si target were changed to 430 W and 1000 W, respectively, and the sputtering gas was changed to a mixture gas containing Ar gas at a flow rate of 15 sccm, $N_2$ gas at a flow rate of 100 sccm and $O_2$ gas at a flow rate of 1 sccm. Under these conditions, while the substrate 11 was being rotated at 30 rpm, a low-stress layer was formed to a thickness of 40 nm under a gas pressure of 0.25 Pa.

Furthermore, the discharge powers applied to the $MoZrSi_4$ target and the Si target were changed to 100 W and 1000 W, respectively, and the sputtering gas was changed to a mixture gas containing Ar gas at a flow rate of 5 sccm, $N_2$ gas at a flow rate of 50 sccm and $O_2$ gas at a flow rate of 5 sccm. Under these conditions, while the substrate 11 was being rotated at 30 rpm, a surface layer was formed to a thickness of 20 nm under a gas pressure of 0.1 Pa.

In this way, the half-tone phase shift layer was formed as a laminated structure comprising the three layers, that is, the optical adjustment layer, the low-stress layer and the surface layer.

[Practicality of Second Light-Shieldable Film as Hard Mask]

Using the photomask blank comprising the first and second light-shieldable films formed under the conditions described above, the practicality of the second light-shieldable film as a hard mask was checked. A chemically amplified photoresist (having a thickness of 100 nm) was applied to the second light-shieldable film and patterned by electron-beam lithography to form a resist mask. Using the resist mask as a mask, the second light-shieldable film (antireflection film) was patterned by fluorine-based dry etching (with the flow rate of $CF_4$ being set at 80 sccm, the applied bias being set at 60 W and the pressure in the chamber being set at 2 Pa).

By observation of the cross section of the photomask blank after the patterning using a scanning electron microscope, it was confirmed that the cross section of the etched photomask blank was adequate, and the first light-shieldable film (light-shielding film) was not substantially etched. From this fact, it was confirmed that the second light-shieldable film (antireflection film) was able to adequately serve as a hard mask for patterning the first light-shieldable film (light shielding film).

[Optical Density]

Using the photomask blank having the first and second light-shieldable films formed under the conditions described above, the optical density of the light-shieldable film in the case where light was launched into the light-shieldable film from the substrate side was measured using a spectrophotometer.

Figure 3:
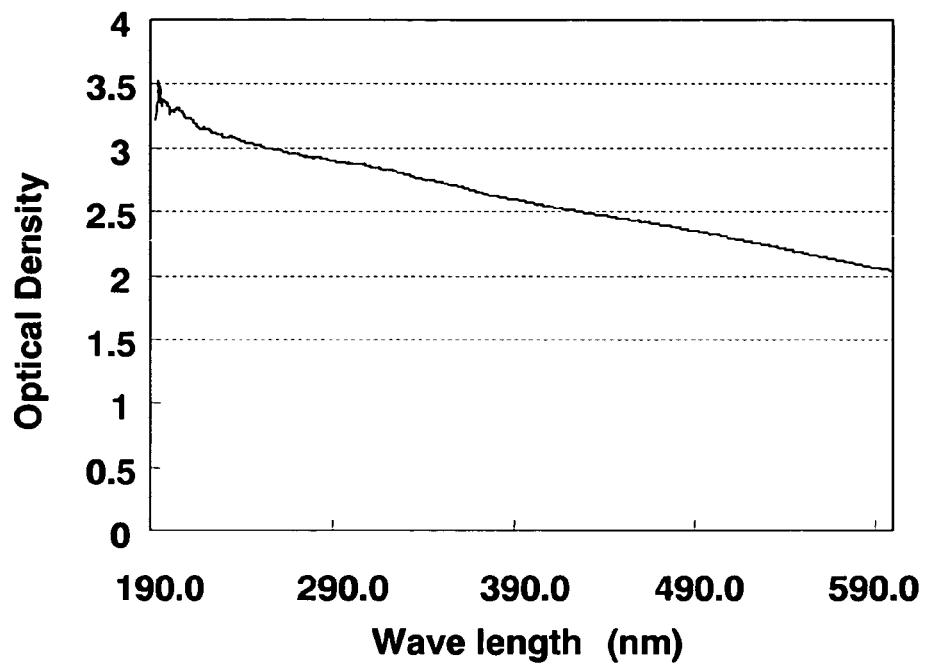
FIG. 3 is a graph showing a wavelength dependence of the optical density (OD) of the photomask blank having a first light-shieldable film of CrN (Cr:N=9:1) and a second light-shieldable film of MoSiN having a thickness of 23.4 nm that overlies the first light-shieldable film.

FIG. 3 is a graph showing a wavelength dependence of the optical density (OD) of the photomask blank having a first light-shieldable film made of CrN (Cr:N=9:1) having a thickness of 40 nm that is formed under the conditions described above and a second light-shieldable film made of MoSiN having a thickness of 23.4 nm that overlies the first light-shieldable film. As shown in this drawing, the optical density for light having a wavelength of 193 nm was about 3.0, and thus, it was confirmed that an optical density of 2.5 or higher was able to be achieved for ArF exposure light.

The second light-shieldable film of the photomask shown in FIG. 3 was formed by continuously changing the film formation conditions as follows: first, when the film formation was started, the flow rates of Ar gas and $N_2$ gas introduced as the sputtering gas into the chamber 101 were set at 20 sccm and 0 sccm, respectively, to achieve a gas pressure of 0.1 Pa in the chamber, and the initial discharge powers applied to the $MoSi_3$ target and the Si target were set at 700 W and 300 W, respectively; then, the flow rate of the Ar gas introduced into the chamber 101 was gradually decreased to 5 sccm, and the flow rate of the $N_2$ gas introduced into the chamber 101 was increased to 50 sccm to achieve a gas pressure of 0.1 Pa in the chamber; and the discharge power applied to the $MoSi_3$ target was decreased to 100 W, and the discharge power applied to the Si target was increased to 900 W.

[Wavelength Dependence of Reflectivity]

Using the photomask blank having the first and second light-shieldable films formed under the conditions described above, light was launched into the light-shieldable film, and the intensity of the light reflected therefrom was measured using a spectrophotometer, thereby determining the wavelength dependence of the reflectivity.

Figure 4:
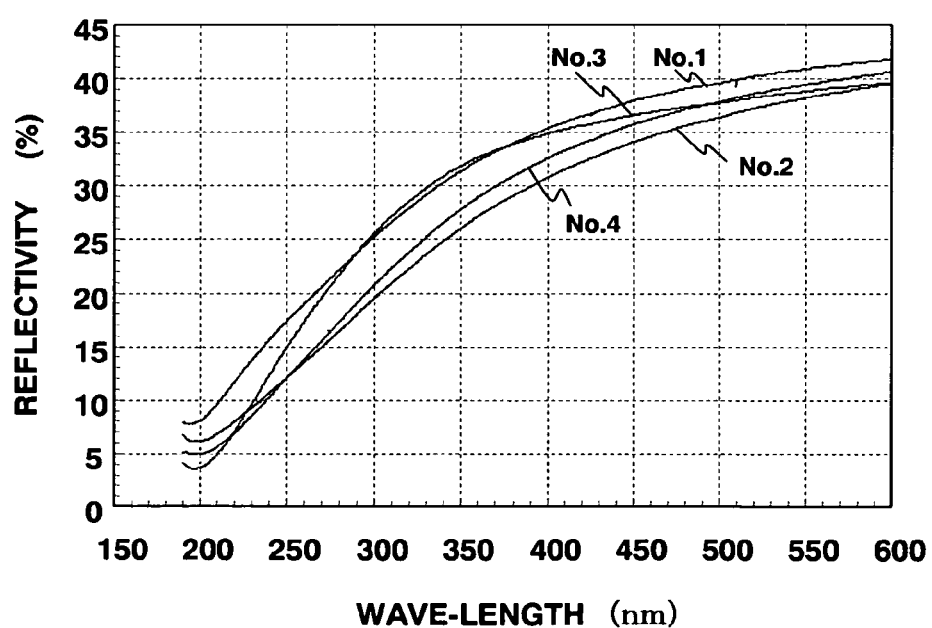
FIG. 4 is a graph showing a result of measurement of the reflectivity for light having wavelengths ranging from 190 nm to 600 nm.

FIG. 4 is a graph showing a result of measurement of the reflectivity for light having wavelengths ranging from 190 nm to 600 nm. Table 1 shows a summary of film formation conditions for evaluation samples Nos. 1 to 4. Here, the evaluation samples Nos. 1 to 3 have a single-layer second light-shieldable film, and the evaluation sample No. 4 has a double-layer second light-shieldable film.

As can be apparently seen from the result shown in FIG. 4, for a wavelength of the ArF exposure light ($\lambda$=193 nm), a low reflectivity of 10% or lower can be achieved, and for an inspection wavelength ($\lambda$=257 nm), the reflectivity can be made to fall within a range of 10 to 20%.

Thus, it was confirmed that, as far as the thickness of the second light-shieldable film (antireflection film) falls within a range of 15 to 30 nm, the reflectivity for the light having a wavelength of 257 nm can be made to fall within a range of 10 to 20%, and a typical defect inspection apparatus can be used for inspection.

As for the evaluation sample No. 3, the sputtering power was kept constant during formation of the second light-shieldable film, and the content of the transition metal in the film has no gradient. In this case, compared with the films formed under different film formation conditions (film formation conditions in which the content of the transition metal in the film has a gradient), the wavelength dependence of the reflectivity is great, and the reflectivity for the light of the inspection wavelength tends to be difficult to control. This is because, compared with other conditions in which both the contents of the transition metal and nitrogen have a gradient, the difference in extinction coefficient k between the region close to the substrate and the region close to the surface is small, so that the multiple reflection condition is rigid. In addition, the second light-shieldable film of the evaluation sample No. 3 has a small content (at %) of the transition metal. With such a composition, the wavelength dependence of the reflectivity tends to become greater, because the extinction coefficient k becomes smaller for longer wavelengths.

TABLE 1

| Film formation condition | Second light-shieldable film structure | Sputtering power $MoSi_3$ (W) | Sputtering power Si (W) | Ar flow rate (SCCM) | $N_2$ flow rate (SCCM) | Formation duration (sec) | Total thickness (Å) |
|---|---|---|---|---|---|---|---|
| No. 1 | Single layer | 700 → 100 | 300 → 900 | 20 → 5 | 0 → 50 | 200 | 197 |
| No. 2 | Single layer | 700 → 100 | 300 → 900 | 20 → 5 | 0 → 50 | 250 | 234 |

TABLE 1-continued

| Film formation condition | Second light-shieldable film structure | | Sputtering power MoSi$_3$ (W) | Sputtering power Si (W) | Ar flow rate (SCCM) | N$_2$ flow rate (SCCM) | Formation duration (sec) | Total thickness (Å) |
|---|---|---|---|---|---|---|---|---|
| No. 3 | Single layer | | 100 | 900 | 20 → 5 | 0 → 50 | 250 | 195 |
| No. 4 | Double layer | (first layer) | 700 → 100 | 300 → 900 | 20 → 5 | 0 → 50 | 200 | 214 |
| | | (second layer) | 100 | 900 | 5 | 50 | 50 | |

[Chemical Stability (Chemical Resistance)]

Using the photomask blank having the first and second light-shieldable films formed under the conditions described above, the chemical stability (chemical resistance) was checked. Specifically, the photomask blank was immersed in an ammonia/hydrogen peroxide mixture (ammonia water:hydrogen peroxide:water=1:1:30 (in volume ratio)) for one hour and in an sulfuric acid/hydrogen peroxide mixture (sulfuric acid:hydrogen peroxide=4:1 (in volume ratio)) for one hour, and then, the change in reflectivity of the photomask blank was measured using a spectrophotometer. The measurement result showed that, for all the conditions described above, the change in reflectivity for a wavelength of 365 nm was 2% or lower. Thus, it was confirmed that the photomask blank exhibited a practically sufficient chemical stability (chemical resistance).

EXAMPLE 3

Fabrication Process of Binary Photomask

With regard to this example, a fabrication process for providing a photomask using a photomask blank according to the present invention will be described. In the following description, it will be supposed that the photomask is a binary mask.

Figure 5A:
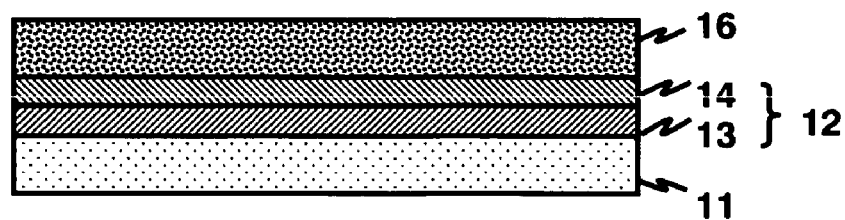
FIGS. 5A to 5E are diagrams for illustrating a fabrication process of a binary photomask.
Figure 5B:
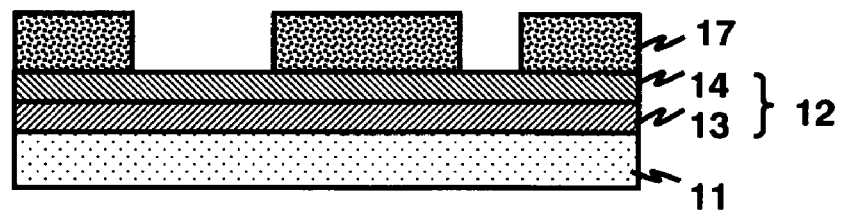

FIGS. 5A to 5E are diagrams for illustrating a fabrication process of a binary photomask. First, a photoresist film 16 is applied onto a light-shieldable film 12 on a substrate 11 (FIG. 5A), and the photoresist 16 is patterned to form a resist pattern 17 for circuit pattern writing (FIG. 5B). Preferably, before applying the photoresist film 16, the substrate is surface-treated to reduce the surface energy thereof. This treatment is intended to prevent the resist mask having been finely patterned from peeling off or falling during a subsequent step.

The most preferable surface treatment is a process of alkyl-silycating the surface of the substrate (actually, the surface of the light-shieldable film) using hexamethyldisilazane (HMDS), commonly used in semiconductor manufacturing processes, or other organic-silicon-based surface treating agents. This process can be conducted by exposing the substrate surface to a gas containing such a surface treatment agent or directly applying the surface treatment agent to the substrate surface.

Selection of the photoresist used depends on the writing apparatus used for forming the photomask pattern. Typically, as an electron beam (EB) writing resist used commonly for fine patterning, a positive type or negative type resist composed of a polymer containing an aromatic moiety is used. To fabricate a photomask with a finer pattern, a chemically amplified resist is preferably used.

The photoresist film 16 is appropriately patterned, and the thickness thereof falls within a range that allows the film to function as an etching mask. In particular, in the case of fabricating a photomask designed for ArF exposure, which requires fine patterning, the photoresist film 16 has to be relatively thin to prevent the aspect ratio thereof from being high, and the thickness of the photoresist film 16 is preferably 350 nm or less and is more preferably 250 nm or less.

On the other hand, the lower limit of the thickness of the photoresist film 16 is determined comprehensively taking into consideration conditions concerning the etching resistance and the like. If a typical resist material is used, the thickness of the photoresist film 16 is preferably 75 nm or more and is more preferably 100 nm or more. In the case of adopting a "multilayer resist technique" that involves a combination of a resist made of a silicone-based resin and a lower film made of an aromatic resin or a "surface imaging technique" that involves a combination of a chemically amplified aromatic resist and a silicone-based surface treatment agent, the total thickness of the photoresist film 16 can be thinner than the values described above. Of course, the application condition and the drying process of the photoresist are appropriately selected depending on the resist used.

Pattern writing on the photoresist film 16 can be conducted by irradiation with light. However, EB irradiation is typically adopted, which is a preferred method for forming a fine pattern. For example, in the case where a chemically amplified resist is used and writing is conducted by irradiating the resist with EB, a pattern is typically written on the resist using an electron beam having an energy density ranging from 3 to 30 μC/cm$^2$, and, then, a heating treatment and a development treatment are conducted to provide the resist pattern 17.

Figure 5C:
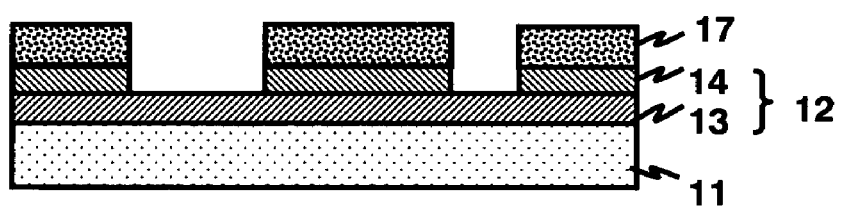

The resulting resist pattern 17 is used as a mask to pattern the second light-shieldable film 14 that is to function as an antireflection film (FIG. 5C). The second light-shieldable film 14 is a film primarily composed of a silicon-containing compound, so that the second light-shieldable film 14 can be patterned by fluorine-based (F-based) or non-oxygen chlorine-based (Cl-based) dry etching. However, according to the present invention, the fluorine-based dry etching, which is less burdensome to the photoresist, is used. The gas used in the fluorine-based dry etching is a fluorine-containing gas, such as $CF_4$ and $C_2F_6$. However, another gas, such as $O_2$, can be added to the fluorine-containing gas, as required.

In this etching step, the first light-shieldable film 13, which is primarily composed of chromium, is not substantially etched. Thus, the resist pattern 17 functions only as an etching mask for the second light-shieldable film 14. Therefore, the thickness of the resist pattern 17 can be reduced as far as it can function as an etching mask for the second light-shieldable film 14, so that the aspect ratio can be prevented from increasing, and the patterning precision can be improved.

Figure 5D:
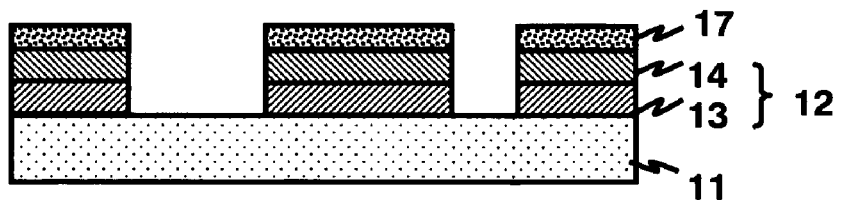
Figure 5E:
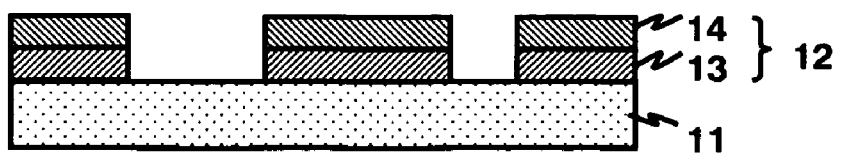

Then, the photoresist 17 and second light-shieldable film 15 having been patterned are used as an etching mask to pattern the first light-shieldable film 13 by oxygen-and-chlorine-based ((Cl+O)-based) dry etching (FIG. 5D). Any particular restrictions are not imposed on the condition of the oxygen-and-chlorine-based dry etching, and well-known oxygen-and-chlorine-based dry etching which has conventionally been used for dry-etching a chromium-compound film can be used. For example, the mixture ratio of chlorine gas and oxygen gas ($Cl_2$ gas:$O_2$ gas) is set at a volume flow ratio of 1:2 to 20:1, and an inert gas, such as helium, is mixed therewith as required. Here, it is confirmed that, if the volume flow ratio of oxygen gas to chlorine gas is 5% or higher, the silicon-containing compound forming the second light-shieldable film is not substantially etched.

In this way, patterning of the light-shieldable film is completed. Then, the resist pattern 17 remaining on the second light-shieldable film 14 is stripped off (FIG. 5E), and final cleaning is conducted using a cleaning fluid, such as a mixture of sulfuric acid and hydrogen peroxide and a mixture of ammonia water and hydrogen peroxide, thereby finishing the binary photomask.

EXAMPLE 4

Fabrication Process of Phase Shift Mask

With regard to this example, a fabrication process for providing a phase shift mask using a photomask blank according to the present invention will be described.

Figure 6A:
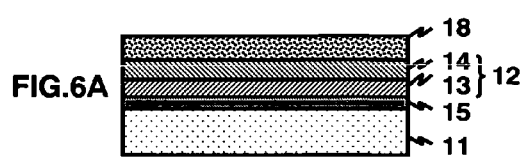
FIGS. 6A to 6I are diagrams for illustrating a first fabrication process of a phase shift mask.
Figure 6F:
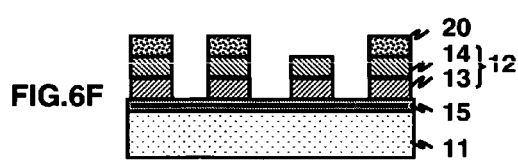
Figure 6B:
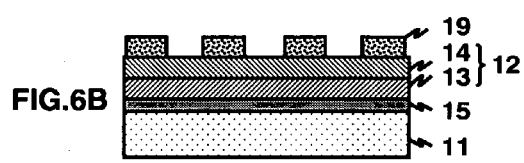

FIGS. 6A to 6I are diagrams for illustrating a fabrication process of a phase shift mask. First, a first photoresist film 18 is applied onto a light-shieldable film 12 formed on a substrate 11 with a phase shift layer 15 interposed therebetween (FIG. 6A), and the photoresist film 18 is patterned to form a first resist pattern 19 for circuit pattern writing (FIG. 6B). As described earlier, before applying the photoresist film 18, the substrate is preferably surface-treated to reduce the surface energy thereof. Furthermore, preferred selection and thickness of the photoresist used are the same as described above.

Figure 6G:
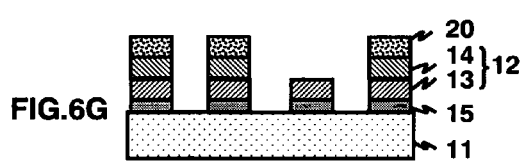
Figure 6C:
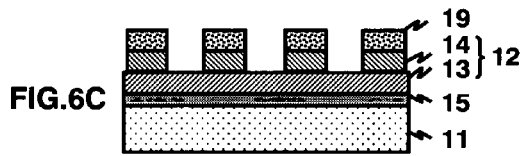

The resulting first resist pattern 19 is used as a mask to pattern the second light-shieldable film 14 that is to function as an antireflection film by fluorine-based dry etching (FIG. 6C).

Figure 6H:
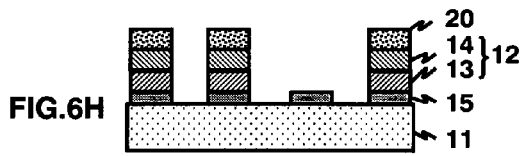
Figure 6D:
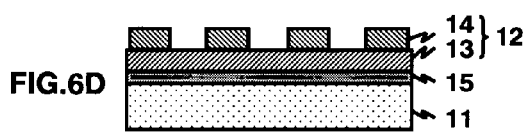
Figure 6I:
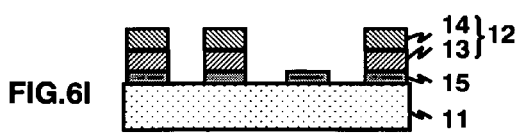
Figure 6E:
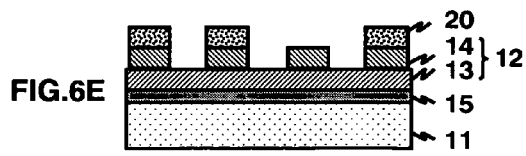

Then, the first resist pattern 19 is stripped off (FIG. 6D), and a second photoresist film is newly applied and patterned, thereby forming a second resist pattern 20 (FIG. 6E). The second resist pattern 20 is formed in such a manner that the light-shieldable film 12 finally remains in a desired region. As for a typical phase shift mask, the fineness of the pattern of the light-shieldable film 12 to be finally provided is lower than that of the pattern of the phase shift layer 15. Therefore, in order to prevent the part of the second light-shieldable film covered with the resist from changing in physical property until the etching process is fully completed, the material of the second photoresist film, which serves as a protective film, is selected giving greater importance to the etching resistance than to the resolution.

Then, the second resist pattern 20 and the second light-shieldable film 14 having been patterned are used as an etching mask to pattern the first light-shieldable film 13 by oxygen-and-chlorine-based ((Cl+O)-based) dry etching (FIG. 6F). The condition of the oxygen-and-chlorine-based dry etching is also the same as described earlier. For example, the mixture ratio of chlorine gas and oxygen gas ($Cl_2$ gas:$O_2$ gas) is set at a volume flow ratio of 1:2 to 20:1, and an inert gas, such as helium, is mixed therewith as required. In this way, patterning of the light-shieldable film 12 is completed.

As described earlier, the phase shift layer 15 is made of silicon oxide, silicon nitride, silicon oxynitride, silicon/transition-metal oxide, silicon/transition-metal nitride, silicon/transition-metal oxynitride or the like in order that the phase shift layer 15 can be etched by fluorine-based dry etching, and the phase shift later 15 is patterned by fluorine-based dry etching. In this step, the part of the second light-shieldable film 14 that is not covered with the second resist pattern 20 is etched, so that it is the first light-shieldable film 13 made of a chromium-based material that functions as an effective etching mask. Thus, the first light-shieldable film 13 functions as a mask to transfer the pattern to the phase shift layer 15 (FIG. 6G).

In this example, the composition and thickness of the phase shift layer 15 are designed so that the clear time of the phase shift layer 15 (the time required to etch off the phase shift layer 15) when the fluorine-based dry etching of the phase shift layer 15 is performed under the same condition as the second light-shieldable film 14 is longer than the clear time of the second light-shieldable film 14. If the clear time is set in this way, the second light-shieldable film 14 is completely removed during the etching step of the phase shift layer 15, and, when the etching step is completed, only the first light-shieldable film 13 made of a chromium-based material remains on the part of the phase shift layer 15 that is not protected by the second resist pattern 20. The etching condition for the phase shift layer 15 may be determined according to a well-known common method.

Then, the first light-shieldable film 13, which has become unnecessary as a light-shieldable film, is removed under a typical etching condition of the chromium-based material (FIG. 6H). Finally, the second resist pattern 20 remaining on the second light-shieldable film 14 is stripped off (FIG. 6I), and final cleaning is conducted using a cleaning fluid, such as a mixture of sulfuric acid and hydrogen peroxide and a mixture of ammonia water and hydrogen peroxide, thereby finishing the phase shift mask.

Figure 7A:
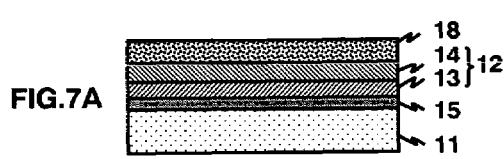
FIGS. 7A to 7I are diagrams for illustrating a second fabrication process of the phase shift mask.
Figure 7F:
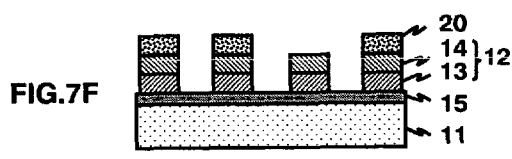
Figure 7B:
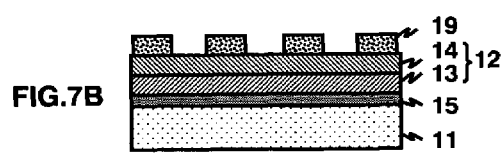
Figure 7G:
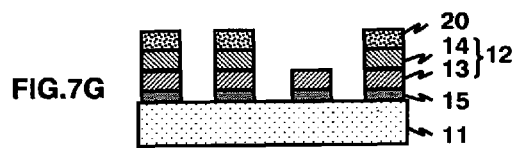
Figure 7C:
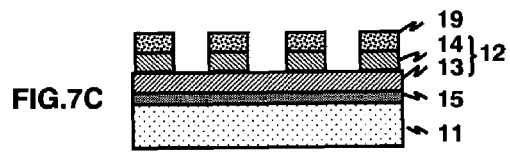
Figure 7H:
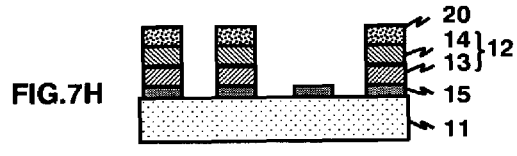
Figure 7D:
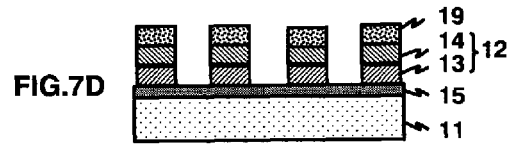
Figure 7I:
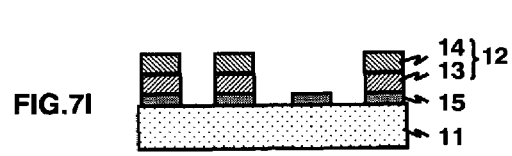
Figure 7E:
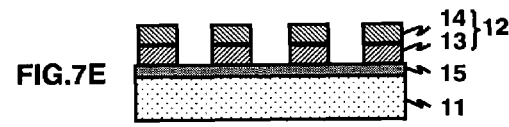

As shown in FIGS. 7A to 7I, the second resist pattern 20 may be formed after etching of the first light-shieldable film 13. In this case, a first photoresist film 18 is applied onto a light-shieldable film 12 (FIG. 7A), the photoresist film 18 is patterned to form a first resist pattern 19 for circuit pattern writing (FIG. 7B), and the first resist pattern 19 is used as a mask to pattern the second light-shieldable film 14 by fluorine-based dry etching (FIG. 7C). Then, the second light-shieldable film 14 (and the first resist pattern 19) is used as an etching mask to pattern the first light-shieldable film 13 by oxygen-and-chlorine-based ((Cl+O)-based) dry etching (FIG. 7D).

Then, the first resist pattern 19 is stripped off (FIG. 7E), and a second photoresist film is newly applied and patterned, thereby forming a second resist pattern 20 (FIG. 7F). Then, the phase shift layer 15 is patterned by fluorine-based dry etching. Specifically, the first light-shieldable film 13 made of a chromium-based material is used as an effective etching mask to transfer the pattern to the phase shift layer 15 (FIG. 7G). The first light-shieldable film 13, which has become unnecessary as a light-shieldable film, is removed under a typical etching condition of the chromium-based material (FIG. 7H). Finally, the second resist pattern 20 remaining on the second light-shieldable film 14 is stripped off (FIG. 7I), and final cleaning is conducted using a cleaning fluid, such as a mixture of sulfuric acid and hydrogen peroxide and a mixture of ammonia water and hydrogen peroxide, thereby finishing the phase shift mask.

EXAMPLE 5

Binary Photomask Blank Having Second Light-Shieldable Film of Chromium Compound

In this comparison example, properties of a binary photomask blank having a second light-shieldable film made of a chromium compound, specifically, CrON, will be described. The first light-shieldable film (light-shielding film) of the binary photomask blank is a CrN film composed of chromium and nitrogen in the composition ratio (atomic ratio) of 9:1 and having a thickness of about 40 nm, and the film formation condition is the same as that described above with regard to the example 2 and thus will not be further described.

On the first light-shieldable film made of CrN, the second light-shieldable film made of CrON was formed using the sputtering apparatus shown in FIG. 2. Specifically, Ar gas was used as the sputtering gas, and Ar gas at a flow rate of 15 sccm, $N_2$ gas at a flow rate of 30 sccm and $O_2$ gas at a flow rate of 15 sccm were introduced into the chamber 101 to achieve a gas pressure of 0.1 Pa in the chamber. The pre-film-formation heating temperature was 120° C., and a discharge power of 1000 W was applied to the Cr target while the substrate 11 was being rotated at 30 rpm, thereby forming a chromium-oxynitride film to a thickness of about 20 nm, which serves as an antireflection film. The chromium-oxynitride film was a CrON film composed of chromium (Cr), oxygen (O), and nitrogen (N) in the composition ratio (atomic ratio) of 4:1:5. Table 2 shows a summary of properties of the binary photomask blank comprising the first and second light-shieldable films stacked in this way.

TABLE 2

| Light-shieldable film structure | Evaluation item | Unit | Measurement condition | Measurement value |
|---|---|---|---|---|
| CrON/CrN | Optical density | | λ = 193 nm | 3.24 |
| | Reflectivity | % | λ = 193 nm | 16.7 |
| | Sheet resistance | ohm/sq. | Four-point probe method | 27 |
| | Thickness | Å | α-step | 589 |

[Optical Density]

Figure 8:
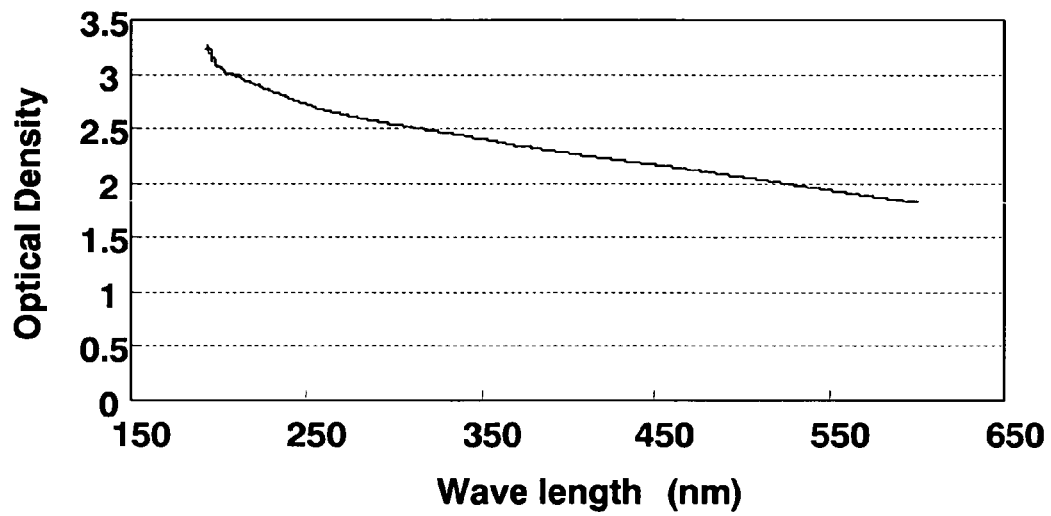
FIG. 8 is a graph showing a wavelength dependence of the optical density of a light-shieldable film of a binary photomask blank having a second light-shieldable film made of chromium compound in the case where light is launched thereto from the side of a substrate, measured using a spectrophotometer.

FIG. 8 is a graph showing a wavelength dependence of the optical density of the light-shieldable film of the binary photomask blank according to this comparison example in the case where light was launched thereto from the substrate side, measured using a spectrophotometer. As shown in this drawing, the optical density for light having a wavelength of 193 nm was about 3.0, and thus, it was confirmed that an optical density of 2.5 or higher was able to be achieved for the ArF exposure.

[Wavelength Dependence of Reflectivity]

The intensity of the reflection light when light is launched into the light-shieldable film of the photomask blank according to this comparison example was measured using a spectrophotometer, thereby determining the wavelength dependence of the reflectivity.

Figure 9:
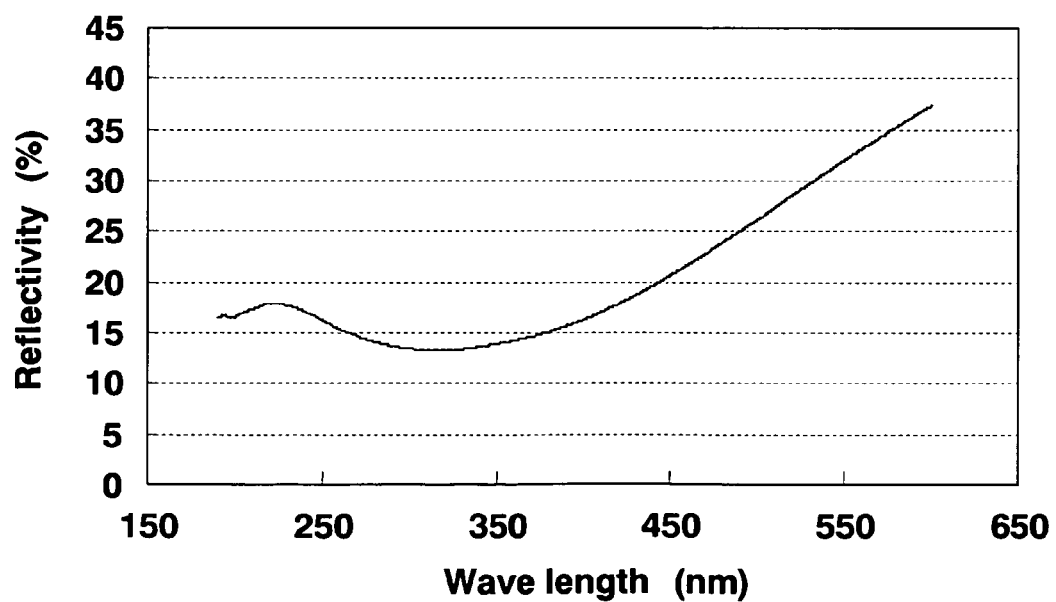
FIG. 9 is a graph showing a result of measurement of the reflectivity of the binary photomask blank having the second light-shieldable film made of chromium compound for light having a wavelength ranging from 190 nm to 600 nm.

FIG. 9 is a graph showing a result of measurement of the reflectivity for light having a wavelength ranging from 190 nm to 600 nm. The reflectivity for light of the ArF exposure wavelength (λ=193 nm) was higher than 15%, and it was confirmed that it is difficult to reduce the reflectivity for the exposure wavelength to a sufficiently low value (10% or lower). The reflectivity of the light-shieldable film in this comparison example for the light having a wavelength of 257 nm is set at 10 to 20%, so that a typical defect inspection apparatus can be used for inspection.

In this way, when the second light-shieldable film is a chromium compound film, if the reflectivity thereof for the light of a wavelength of 257 nm is set at 10 to 20%, the reflectivity for the light of the ArF exposure wavelength cannot be reduced to 10% or lower. To the contrary, the photomask blank according to the present invention that has the second light-shieldable film containing a layer primarily composed of a silicon-containing compound can achieve a reflectivity of 10 to 20% for the light having a wavelength of 257 nm while reducing the reflectivity for the light of the ArF exposure wavelength to 10% or lower.

EXAMPLE 6

Second Example of Fabrication Process of Photomask Blank

With regard to this example, there will be described a second example of the fabrication process for providing a photomask blank according to the present invention that has the structure described with regard to the example 1.

[First Light-Shieldable Film (Light-Shielding Film)]

In this example also, a sputtering apparatus used for forming a first light-shieldable film of a photomask blank according to the present invention is constructed as shown in FIG. 2. In this drawing, reference numeral 11 denotes a transparent substrate, which is a 6-inch rectangular quartz substrate, reference numeral 101 denotes a chamber, reference numeral 102a denotes a first target, reference numeral 102b denotes a second target, reference numeral 103 denotes a sputtering gas inlet, reference numeral 104 denotes a gas outlet, reference numeral 105 denotes a substrate rotating table, and reference numerals 106a and 106b denote power supplies that apply a bias to the first and second targets, respectively.

In this example, the first target 102a is a chromium target, and only the target is sputtered to form a first light-shieldable film of chromium. The sputtering gas was Ar gas, and the Ar gas and $N_2$ gas were introduced into the chamber 101 at flow rates of 10 sccm and 4 sccm, respectively, to achieve a gas pressure of 0.1 Pa in the chamber. The pre-film-formation heating temperature was 120° C., and a discharge power of 1000 W was applied to the Cr target while the substrate 11 was being rotated at 30 rpm, thereby forming a chromium-nitride film to a thickness of 10 nm, which serves as a first light-shieldable film (light-shielding film). The chromium-nitride film was a CrN film composed of chromium (Cr) and nitrogen (N) in the composition ratio (atomic ratio) 9:1 (Cr:N=9:1).

[Second Light-Shieldable Film]

Using the sputtering apparatus constructed as shown in FIG. 2, a second light-shieldable film (antireflection film) was formed on the first light-shieldable film (light-shielding film), thereby forming a light-shieldable film of a photomask blank according to the present invention. The first target 102a used in this step was a silicon (Si) single crystal, and the second target 102b used in this step was a molybdenum-silicide ($MoSi_2$) polycrystal. The gas flow rate was set so that the gas pressure in the chamber during film formation was 0.1 Pa, and a multilayer film of a molybdenum-silicide-compound (MoSiN film) was formed while the substrate was being rotated at 30 rpm.

Specifically, Ar gas at a flow rate of 20 sccm and $N_2$ gas at a flow rate of 10 sccm were introduced as the sputtering gas into the chamber 101 to achieve a gas pressure of 0.1 Pa in the chamber, discharge powers of 200 W and 800 W were applied to the $MoSi_2$ target and the Si target, respectively, and then, formation of a film was started while the substrate 11 was being rotated at 30 rpm. Once the thickness of the film reached 33 nm, another film was formed to a thickness of about 18 nm while continuously changing the film formation conditions as follows: the flow rate of the Ar gas introduced into the chamber 101 was gradually decreased to 5 sccm, and the flow rate of the $N_2$ gas introduced into the chamber 101 was increased to 50 sccm to achieve a gas pressure of 0.1 Pa in the chamber; and the discharge power applied to the $MoSi_2$ target was decreased to 200 W, and the discharge power applied to the Si target was increased to 800 W. Under such film formation conditions, a light shielding film (having a thickness of 51 (=33+18) nm) can be formed that has an antireflective layer having a "composition gradient structure" in which the content of a transition metal or nitrogen in the film varies gradually. The thickness of the second light-shieldable film is preferably equal to or more than 10 nm and equal to or less than 55 nm.

[Third Optical Film]

As with the first and second light-shieldable films, the third optical film is also formed using the sputtering apparatus constructed as shown in FIG. 2. As described earlier, in the case where the third optical film is a half-tone phase shift layer, the film is preferably made of silicon oxide, silicon nitride, silicon oxynitride, silicon/transition-metal oxide, silicon/transition-metal nitride or silicon/transition-metal oxynitride. Thus, the sputtering target is appropriately selected depending on the compound forming the half-tone phase shift layer, and the third optical film is formed under generally the same conditions as the second light-shieldable film described above.

The half-tone phase shift layer may be a composite film comprising a stack of films of different compositions. The half-tone phase shift layer is designed to have such a composition that the single-layer or multilayer film made of one or more materials selected from among those described above have a transmittance of 2-40% and a phase shift of about 180°. A specific example of the film formation is as follows.

First, using a Si single crystal as the first target 102a and a $MoZrSi_4$ sintered body as the second target 102b, discharge powers of 560 W and 1000 W were applied to the $MoZrSi_4$ target and the Si target, respectively, while the substrate 11 was being rotated at 30 rpm, thereby sputter-forming an optical adjustment layer to a thickness of 10 nm on the substrate 11. The sputtering gas used was a mixture gas containing Ar gas at a flow rate of 8 sccm, $N_2$ gas at a flow rate of 20 sccm and $O_2$ gas at a flow rate of 5 sccm. The gas pressure in the chamber during sputtering was set at 0.15 Pa.

Then, the discharge powers applied to the $MoZrSi_4$ target and the Si target were changed to 430 W and 1000 W, respectively, and the sputtering gas was changed to a mixture gas containing Ar gas at a flow rate of 15 sccm, $N_2$ gas at a flow rate of 100 sccm and $O_2$ gas at a flow rate of 1 sccm. Under these conditions, while the substrate 11 was being rotated at 30 rpm, a low-stress layer was formed to a thickness of 40 nm under a gas pressure of 0.25 Pa.

Furthermore, the discharge powers applied to the $MoZrSi_4$ target and the Si target were changed to 100 W and 1000 W, respectively, and the sputtering gas was changed to a mixture gas containing Ar gas at a flow rate of 5 sccm, $N_2$ gas at a flow rate of 50 sccm and $O_2$ gas at a flow rate of 5 sccm. Under these conditions, while the substrate 11 was being rotated at 30 rpm, a surface layer was formed to a thickness of 20 nm under a gas pressure of 0.1 Pa.

In this way, the half-tone phase shift layer was formed as a laminated structure comprising the three layers, that is, the optical adjustment layer, the low-stress layer and the surface layer.

[Evaluation of Cross-Sectional Configuration of Dry-Etched Light-Shieldable Film]

Using the photomask blank comprising the first and second light-shieldable films formed under the conditions described above, the cross-sectional configuration of the light-shieldable film was checked. First, a chemically amplified photoresist (having a thickness of 200 nm) was applied to the second light-shieldable film and patterned by electron beam lithography to form a resist mask. Using the resist mask as a mask, the second light-shieldable film (antireflection film) was patterned by fluorine-based dry etching (with the flow rate of $SF_6$ being set at 18 sccm, the flow rate of $O_2$ being set at 45 sccm, the applied RIE voltage being set at 200 V, the ICP power being set at 325 W and the pressure in the chamber being set at 5 mTorr).

At this point in time, from observation of the cross section of the light-shieldable film after the patterning using a scanning electron microscope (SEM), it was confirmed that the first light-shieldable film (light-shielding film) was not substantially etched. From this fact, it was confirmed that the second light-shieldable film (antireflection film) was able to adequately serve as a hard mask for patterning the first light-shieldable film (light shielding film). In addition, it was confirmed that the first light-shieldable film was able to adequately serve as an etch stop against fluorine-based dry etching.

Then, the first light-shieldable film was etched by chlorine-based dry etching (with the flow rate of $Cl_2$ being set at 18 sccm, the flow rate of $O_2$ being set at 55 sccm, the flow rate of He being set at 10 sccm, the RIE voltage being set at 600 V, the ICP power being et at 400 W and the pressure in the chamber being set at 6 mTorr), thereby finishing the patterning of the entire light-shieldable film. Following the patterning, the resulting cross-sectional configuration (whether side etching occurred or not) was checked by SEM observation. Table 3 shows a summary of the observation results. For all the light-shieldable films in this table, the first light-shieldable film (Cr film) has a thickness of 10 nm, and the second light-shieldable film (MoSiN/MoSi(N) film) has a thickness of 51 nm.

TABLE 3

| Minimum content of nitrogen in second light-shieldable film (at %) | Cross-sectional configuration of light-shieldable film |
| --- | --- |
| 0 | Side etching occurs |
| 5 | Adequate |
| 10 | Adequate |
| 45 | Adequate |

Figure 10A:
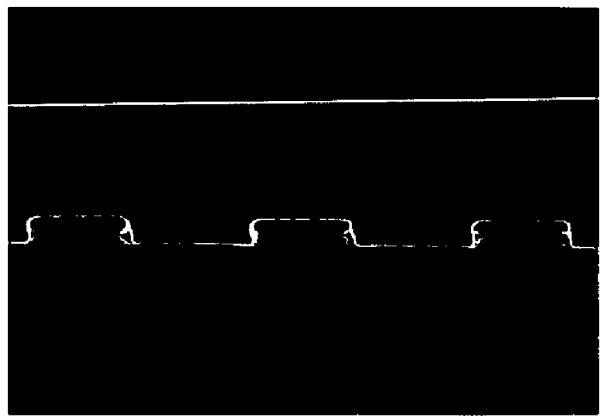
FIGS. 10A to 10C show SEM images for illustrating cross-sectional configurations of dry-etched light-shieldable films whose minimum contents of nitrogen in the second light-shieldable film are 0 at % (FIG. 10A), 5 at % (FIG. 10B) and 10 at % (FIG. 10C)
Figure 10B:
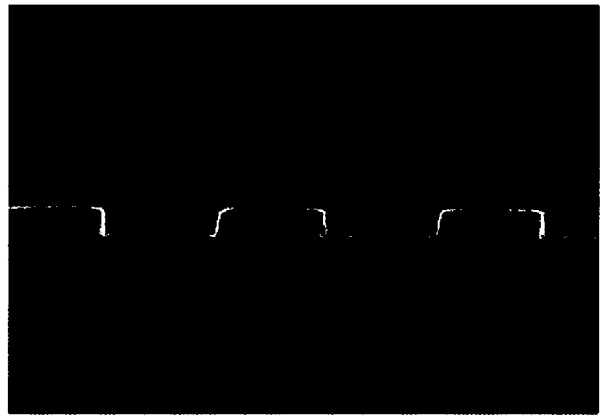
Figure 10C:
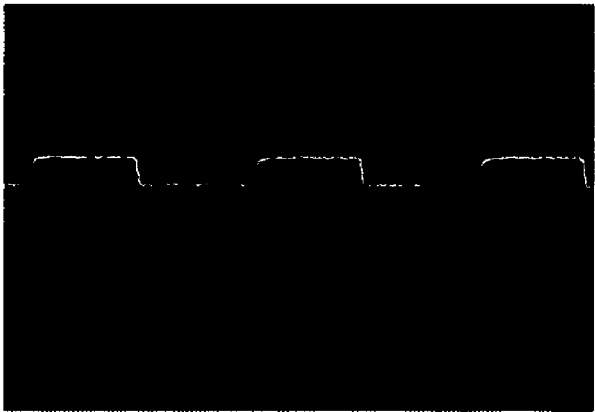

FIGS. 10A to 10C show SEM images for illustrating the cross-sectional configurations of dry-etched light-shieldable films whose minimum contents of nitrogen in the second light-shieldable film are 0 at % (FIG. 10A), 5 at % (FIG. 10B) and 10 at % (FIG. 10C). As can be apparently seen from these SEM images, the cross-sectional configuration of the dry-etched light-shieldable film (whether side etching occurs or not) depends on the content of nitrogen in the second light-shieldable film. In addition, it is shown that, if the nitrogen content is equal to or higher than 5 at %, the occurrence of side etching is suppressed, and an adequate cross-sectional configuration results. Taking into consideration the results described above, the content of nitrogen in the second light-shieldable film is preferably equal to or higher than 5 at % and equal to or lower than 20 at %.

Table 4 shows a summary of the dependences of the cross-sectional configuration of dry-etched light-shieldable films on the thicknesses of the first and second light-shieldable films, observed in the same manner as described above.

TABLE 4

| Thickness of first light-shieldable film (nm) | Thickness of second light-shieldable film (nm) | Cross-sectional configuration of dry-etched light-shieldable film |
|---|---|---|
| 3 | 51 | Adequate |
| 10 | 51 | Adequate |
| 15 | 45 | Adequate |
| 20 | 45 | Side etching occurs |

From the results shown in this table, it can be seen that, if the thickness of the first light-shieldable film falls within a range of 3 to 15 nm, no side etching occurs, and the dry-etched light-shieldable film can have an adequate cross-sectional configuration. Taking into consideration the results described above, the thickness of the second light-shieldable film is preferably equal to or more than 25 nm and equal to or less than 55 nm, and the thickness of the first light-shieldable film is preferably equal to or more than 5 nm and equal to or less than 15 nm.

[Optical Density]

Using the photomask blank having the first and second light-shieldable films formed on the quartz substrate under the conditions described above, the optical density of the light-shieldable film in the case where light was launched into the light-shieldable film from the substrate side was measured using a spectrophotometer.

Figure 11:
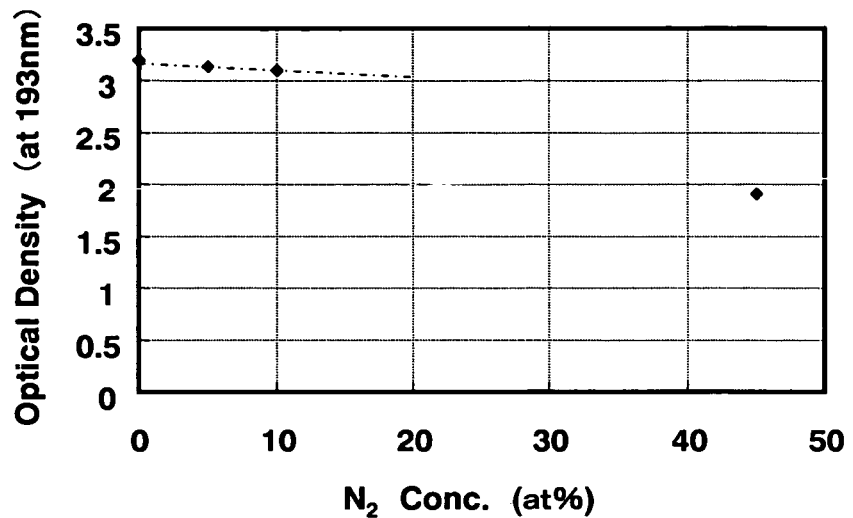
FIG. 11 is a graph showing a relationship between the optical density (OD) and minimum nitrogen content of the photomask blank having a first light-shieldable film made of CrN (Cr:N=9:1) having a thickness of 10 nm and a second light-shieldable film made of MoSiN having a thickness of 51 nm overlying the first light-shieldable film according to an example 6.

FIG. 11 is a graph showing a relationship between the optical density (OD) and minimum nitrogen content of the photomask blank having a first light-shieldable film made of CrN (Cr:N=9:1) having a thickness of 10 nm that is formed under the conditions described above and a second light-shieldable film made of MoSiN having a thickness of 51 nm that overlies the first light-shieldable film. As shown in this drawing, for a wide range of minimum nitrogen content of the second light-shieldable film not higher than 20 at %, the optical density for light having a wavelength of 193 nm was about 3.0, and thus, it was confirmed that an optical density of 2.5 or higher was able to be achieved for the ArF exposure.

[Wavelength Dependence of Reflectivity]

Figure 12:
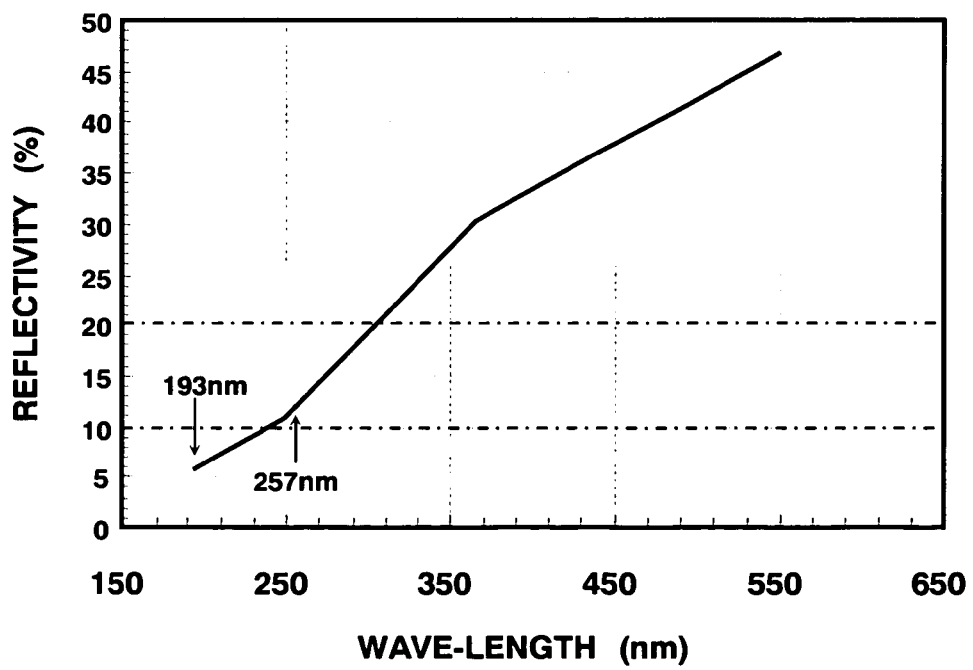
FIG. 12 is a graph showing a wavelength dependence of the reflectivity of the light-shieldable film determined by measuring, using a spectrophotometer, the intensity of the reflection light in the case where light is launched into the light-shieldable film of the photomask blank comprising the first and second light-shieldable films according to the example 6.

FIG. 12 is a graph showing a wavelength dependence of the reflectivity of the light-shieldable film determined by measuring, using a spectrophotometer, the intensity of the reflection light in the case where light is launched into the light-shieldable film of the photomask blank comprising the first and second light-shieldable films formed under the conditions described above. The measurement wavelength ranges from 193 nm to 600 nm.

As can be apparently seen from the result shown in this drawing, for light of the ArF exposure wavelength (λ=193 nm), a low reflectivity of 10% or lower can be achieved, and for the light of the inspection wavelength (λ=257 nm), the reflectivity can be made to fall within a range of 10 to 20%.

Thus, it was confirmed that, in the case where the second light-shieldable film (antireflection film) is a multilayer film having a composition gradient structure in which the nitrogen content has a gradient from a layer with low nitrogen content to a layer with high nitrogen content, the reflectivity can be 10 to 20% for the light having a wavelength of 257 nm, and a typical defect inspection apparatus can be used for inspection, as far as the thickness of the layer with high nitrogen content (including a composition gradient region) falls within a range of 15 to 30 nm.

[Chemical Stability (Chemical Resistance)]

Using the photomask blank having the first and second light-shieldable films formed under the conditions described above, the chemical stability (chemical resistance) was checked. Specifically, the photomask blank was immersed in an ammonia/hydrogen peroxide mixture (ammonia water: hydrogen peroxide:water=1:1:30 (in volume ratio)) for one hour and in an sulfuric acid/hydrogen peroxide mixture (sulfuric acid:hydrogen peroxide=4:1 (in volume ratio)) for one hour, and then, the change in reflectivity of the photomask blank was measured using a spectrophotometer. The measurement result showed that, for all the conditions described above, the change in reflectivity for a wavelength of 365 nm was 2% or lower. Thus, it was confirmed that the photomask blank exhibited a practically sufficient chemical stability (chemical resistance).

While a photomask blank according to the present invention and a photomask fabricated using the photomask blank have been described with reference to examples, the examples are intended only for illustration of the present invention, and the present invention is not limited thereto. It is obvious that the examples can be modified in various ways without departing from the scope of the present invention, and various other examples are possible within the scope of the present invention.

The present invention provides a photomask that is finely patterned with high precision and a photomask blank used for providing the photomask.

What is claimed is:

1. A binary photomask blank, comprising a light-shieldable film formed on a substrate that is transparent to exposure light, the light-shieldable film comprising a first light-shieldable film formed on the substrate and a second light-shieldable film overlying the first light-shieldable film,
   wherein the first light-shieldable film is a film primarily composed of chromium metal, chromium oxide, chromium nitride, chromium oxynitride, chromium oxycarbide, chromium nitride carbide or chromium oxynitride carbide that is not substantially etched by fluorine-based dry etching and which has a thickness that is equal to or more than 3 nm and equal to or less than 15 nm, and
   wherein the second light-shieldable film having an antireflection capability comprises a layer primarily composed of a silicon-containing compound that is capable of being etched by fluorine-based dry etching, and
   wherein the optical density of the light-shieldable film comprising the stack of the first and second light-shieldable films to exposure light is 2.5 or higher.

2. The binary photomask blank according to claim 1, wherein the silicon-containing compound is silicon oxide, silicon nitride, silicon oxynitride, silicon/transition-metal oxide, silicon/transition-metal nitride, or silicon/transition-metal oxynitride.

3. The binary photomask blank according to claim 2, wherein the transition metal is at least one metal element selected from among titanium (Ti), vanadium (V), cobalt (Go), nickel (Ni), zirconium (Zr), niobium (Nb), molybdenum (Mo), hafnium (Hf), tantalum (Ta), and tungsten (W).

4. The binary photomask blank according to claim 1, wherein the second light-shieldable film has a thickness that is equal to or more than 10 nm and equal to or less than 55 nm.

5. The binary photomask blank according to claim 4, wherein the second light-shieldable film has a thickness that is equal to or more than 25 nm and equal to or less than 55 nm.

6. A photomask that is fabricated using a binary photomask blank according to claim 5.

7. The binary photomask blank according to claim 1, wherein the extinction coefficient k of the second light-shieldable film at a wavelength of the exposure light has a profile that gradually decreases from the side of the substrate to the surface of the second light-shieldable film.

8. The binary photomask blank according to claim 1, wherein at least one of the first light-shieldable film and the second light-shieldable film has a multilayer structure comprising a plurality of layers stacked successively.

9. A photomask that is fabricated using a binary photomask blank according to claim 8.

10. A photomask that is fabricated using a binary photomask blank according to claim 1.

11. The binary photomask blank according to claim 5, wherein at least one of the first light-shieldable film and the second light-shieldable film has a multilayer structure comprising a plurality of layers stacked successively.

12. A photomask blank, comprising an optical film formed on a substrate that is transparent to exposure light and a light-shieldable film formed on the optical film,
wherein the light-shieldable film comprises a first light-shieldable film formed on the optical film and a second light-shieldable film overlying the first light-shieldable film,
wherein the first light-shieldable film comprises a layer primarily composed of chromium metal, chromium oxide, chromium nitride, chromium oxynitride, chromium oxycarbide, chromium nitride carbide or chromium oxynitride carbide that is not substantially etched by fluorine-based dry etching and which has a thickness that is equal to or more than 3 nm and equal to or less than 15 nm, and
wherein the second light-shieldable film comprises a layer primarily composed of a silicon-containing compound that is capable of being etched by fluorine-based dry etching.

13. The photomask blank according to claim 12, wherein the optical film is a half-tone phase shift layer, and the half-tone phase shift layer is made of silicon oxide, silicon nitride, silicon oxynitride, silicon/transition-metal oxide, silicon/transition-metal nitride or silicon/transition-metal oxynitride.

14. The photomask blank according to claim 13, wherein the optical film is a film capable of being etched by fluorine-based dry etching, and the time (clear time) required for etching off the optical film by fluorine-based dry etching under the same condition as the second light-shieldable film is longer than the clear time for the second light-shieldable film.

15. The binary photomask blank according to claim 13, wherein the second light-shieldable film has a thickness that is equal to or more than 10 nm and equal to or less than 55 nm.

16. The photomask blank according to claim 13, wherein at least one of the first light-shieldable film and the second light-shieldable film has a multilayer structure comprising a plurality of layers stacked successively.

17. A photomask that is fabricated using a photomask blank according to claim 13.

18. The photomask blank according to claim 12, wherein the optical film is a film capable of being etched by fluorine-based dry etching, and the time (clear time) required for etching off the optical film by fluorine-based dry etching under the same condition as the second light-shieldable film is longer than the clear time for the second light-shieldable film.

19. A photomask that is fabricated using a photomask blank according to claim 18.

20. The photomask blank according to claim 12, wherein the second light-shieldable film has a thickness that is equal to or more than 10 nm and equal to or less than 55 nm.

21. A photomask that is fabricated using a photomask blank according to claim 20.

22. The photomask blank according to claim 12, wherein at least one of the first light-shieldable film and the second light-shieldable film has a multilayer structure comprising a plurality of layers stacked successively.

23. A photomask that is fabricated using a photomask blank according to claim 22.

24. A photomask that is fabricated using a photomask blank according to claim 12.

* * * * *

UNITED STATES PATENT AND TRADEMARK OFFICE
CERTIFICATE OF CORRECTION

PATENT NO. : 7,625,676 B2 Page 1 of 1
APPLICATION NO. : 11/255135
DATED : December 1, 2009
INVENTOR(S) : Hiroki Yoshikawa et al.

It is certified that error appears in the above-identified patent and that said Letters Patent is hereby corrected as shown below:

In claim 3, column 24, lines 57-58, "cobalt (Go)" should read "cobalt (Co)".

Signed and Sealed this

Ninth Day of March, 2010

David J. Kappos
*Director of the United States Patent and Trademark Office*